United States Patent [19]

Castro

[11] Patent Number: 5,088,066
[45] Date of Patent: Feb. 11, 1992

[54] REDUNDANCY DECODING CIRCUIT USING N-CHANNEL TRANSISTORS

[75] Inventor: Hernan A. Castro, Shingle Springs, Calif.

[73] Assignee: Intel Corporation, Santa Clara, Calif.

[21] Appl. No.: 309,320

[22] Filed: Feb. 10, 1989

[51] Int. Cl.⁵ .............................................. G11C 8/00
[52] U.S. Cl. ................................ 365/230.06; 365/49; 365/200
[58] Field of Search ............ 365/49, 200, 230.06; 307/449, 463

[56] References Cited

U.S. PATENT DOCUMENTS

| | | | |
|---|---|---|---|
| 3,633,175 | 1/1972 | Harper | 364/200 |
| 3,659,275 | 4/1972 | Marshall | 365/94 |
| 3,735,368 | 5/1973 | Beausoleil | 365/200 |
| 3,753,235 | 8/1973 | Daughton et al. | 365/200 |
| 3,753,244 | 8/1973 | Sumilas et al. | 365/200 |
| 4,051,354 | 9/1977 | Choate | 365/200 |
| 4,250,570 | 2/1981 | Tsang et al. | 365/200 |
| 4,358,833 | 11/1982 | Folmsbee et al. | 365/200 |
| 4,441,170 | 4/1984 | Folmsbee et al. | 365/200 |
| 4,862,417 | 8/1989 | List et al. | 365/230.06 |

OTHER PUBLICATIONS

G. Canepa et al., "A 90ns 4Mb CMOS EPROM", ISSCC 88, Session X, Feb. 18, 1988, pp. 120–125.

*Primary Examiner*—Joseph A. Popek
*Attorney, Agent, or Firm*—Blakely, Sokoloff, Taylor & Zafman

[57] ABSTRACT

Four n-channel transistor, single-stage XNOR/XOR decoding circuit provides for an improved performance of a decoding circuit using CAMs to access redundant memory.

13 Claims, 3 Drawing Sheets

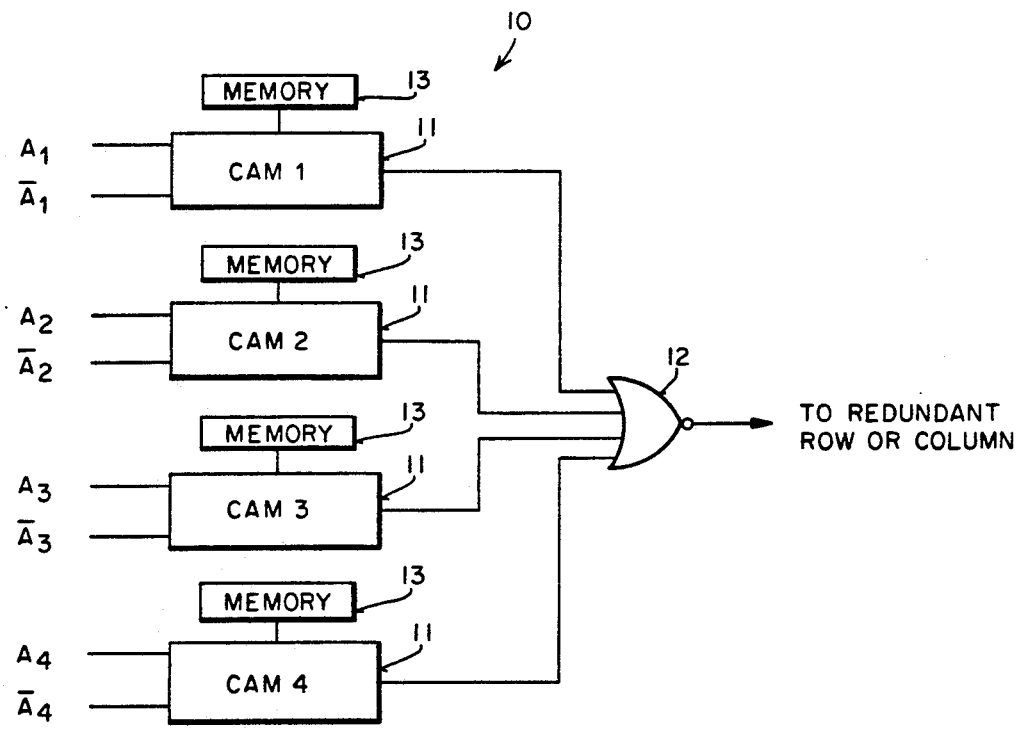
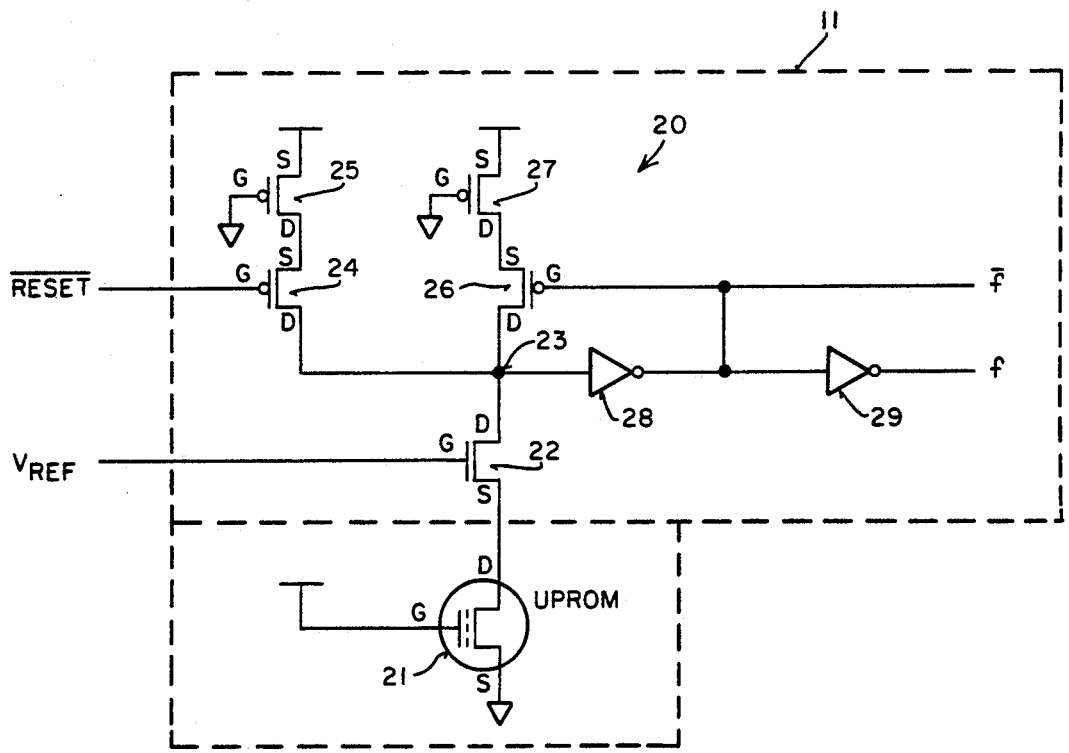

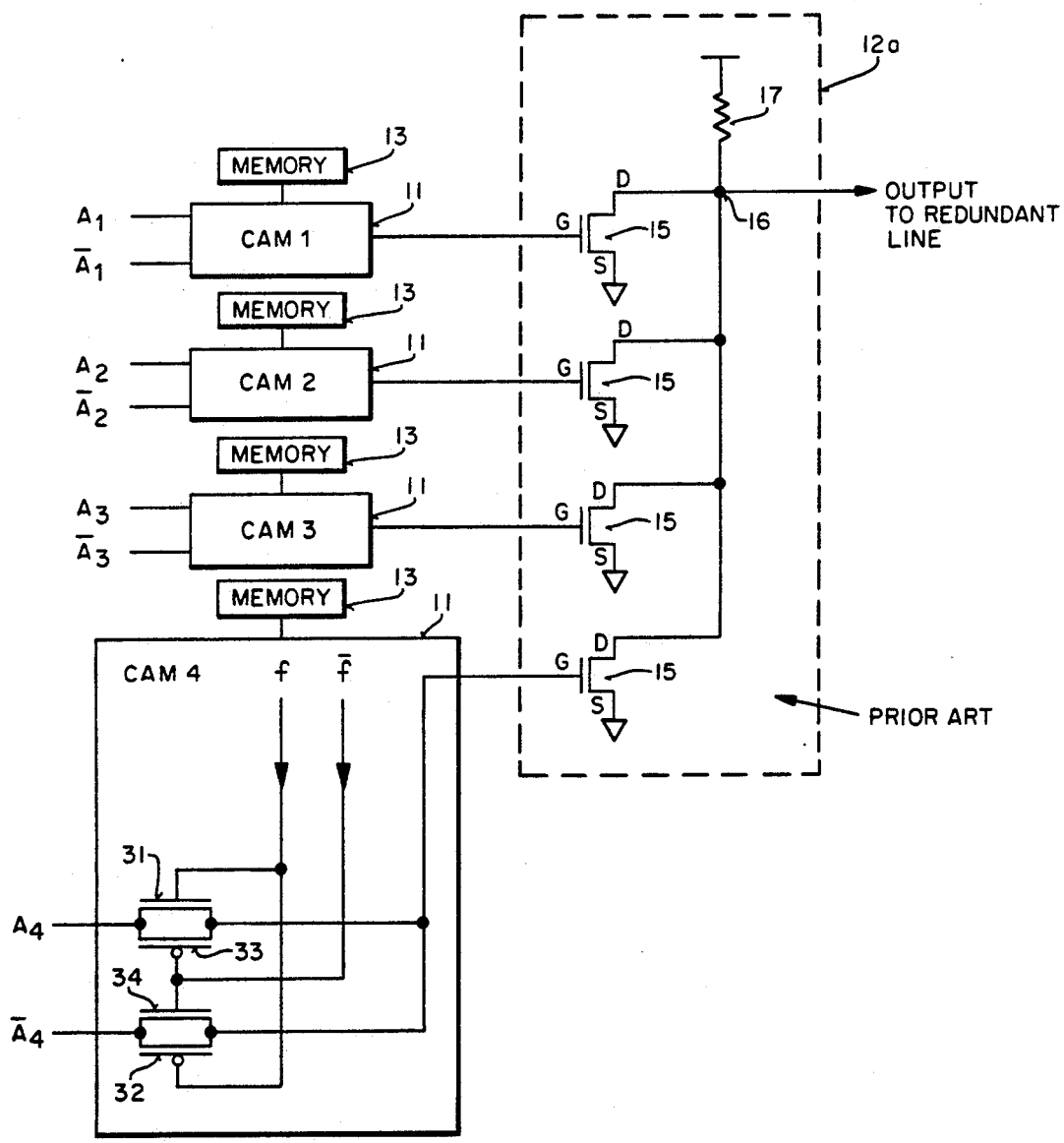

FIG_4
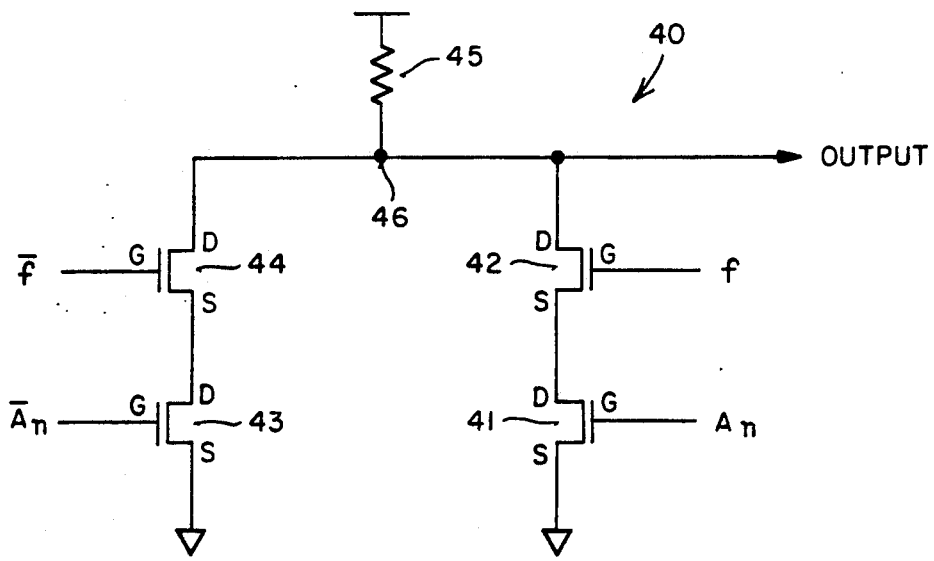
FIG_5
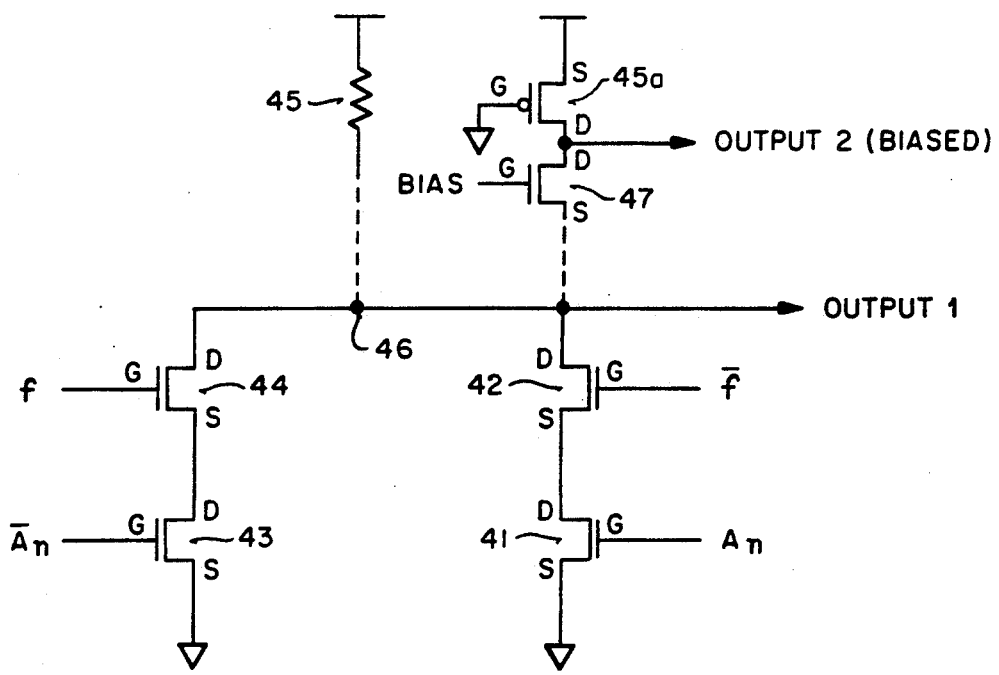

5,088,066

REDUNDANCY DECODING CIRCUIT USING N-CHANNEL TRANSISTORS

BACKGROUND OF THE INVENTION

1. Field of the Invention

This invention relates to the field of memory arrays and in particular to a circuitry for providing a XNOR/XOR decoding for on-chip redundant memory.

2. Prior Art

An arrayed memory, such as a random access memory (RAM) or an erasable programmable read-only-memory (EPROM), is generally comprised of an array of binary elements arranged in a matrix of rows and columns. Addresses associated with the array access memory locations within the array. Typically, decoders are coupled to the memory to provide the decoding of the address signals. The design and manufacture of various semiconductor memories, where memory cells are arranged in an array, are well-known in the prior art.

In the manufacture of such memory arrays, processing defects often randomly occur across the memory chip. In most instances, these memory chips are fully functional except for a single or a small number of row or column containing a defective cell. In order not to scrap a chip for having a single or a small number of defects, defect tolerant memory devices have been devised in which a redundant row and/or column of cells is substituted for a selected row and/or column containing the defective cell(s).

For example, in U.S. Pat. No. 3,659,275, a system is described in which at least one read-only-memory having permanently stored data therein is accessed in parallel with a correction or redundant memory element. U.S. Pat. Nos. 3,735,368 a monolithic memory is constructed of components which contain defective bit cells. In U.S. Pat. Nos. 3,753,244 and 3,753,235 teach a redundancy scheme where redundancy is provided by having an extra line of cells on the chip together with a defective address store. A comparator circuit is provided for disabling a defective line of cells and replacing it with the extra line of cells in a technique of pre-wired substrates for monolithic memories. In U.S. Pat. No. 4,051,354, a fault tolerant cell addressable array having one or more superfluous rows and/or columns of cells is held in reserve. The memory chips with faulty cells are corrected by programming the memory with the cell addresses of the faulty cell locations.

More recently, a redundant memory circuit for a memory array in which the memory has a preselected number of rows or columns having addresses associated therewith and decoders coupled thereto and one or more redundant rows or columns having initially unspecified address associated therewith and redundant decoders coupled thereto is taught in U.S. Pat. No. 4,250,570. The redundant memory circuit programs the redundant decoders coupled to the redundant rows or columns having initially unspecified addresses to match the addresses of defective rows or columns having addresses associated therewith and disables one or more of the defective rows or columns having addresses associated therewith. The programming of the decoders is achieved by the use of fusible links, wherein the address decoding is achieved by open circuiting selected fusible links.

An improved addressing scheme for single chip memories which includes a plurality of redundant lines and associated cells is taught in U.S. Pat. Nos. 4,358,833 and 4,441,170. Aside from fusible links, other schemes are known in the prior art for providing the programming of the decoders to provide redundancy. That is, once the defective row and/or column addresses are known, then the redundant row and/or column decoders must be programmed to replace the defective line.

Further, another scheme for providing redundancy is achieved by the use of a content addressable memory (CAM). A content addressable memory provides for storing the addresses of defective locations of the main memory array. One such defect tolerant memory system using a CAM is taught in U.S. Pat. No. 3,633,175. However, more recently semiconductor memory devices utilize redundancy schemes where the redundancy elements are similar to the cells used in the main memory. That is, for an EPROM semiconductor memory, EPROM cells are used for redundant memory also. Instead of fusible links, actual memory cells are used to provide the programming.

In redundancy circuits using CAMs to program the redundant addresses, the decoded outputs from the CAMs are typically coupled together for activating the respective redundant memory line. Gating means, such as a NOR gate, is used to combine the outputs from the CAMs. The present invention utilizes a specialized XNOR (exclusive NOR)/XOR exclusive OR) decoding circuit for accessing redundant memory.

SUMMARY OF THE INVENTION

A decoding circuit for decoding address signals to access redundant memory is described. Two pairs of n-channel transistors are arranged to provide XNOR/XOR decoding to an inputted address signal and its complement by a function code stored in a memory cell associated with a CAM. The function code signal and its complement are coupled along with the pair of address signals to the four decoding transistors.

The four n-channel transistor scheme is an improvement over a two-stage prior art XNOR/XOR decoder, resulting in improved speed performance and simplicity of chip layout.

BRIEF DESCRIPTION OF THE DRAWINGS

FIG. 1 is a block schematic diagram showing a redundancy decoder of the present invention using CAMs.

FIG. 2 is a circuit schematic diagram showing a CAM circuit of the present invention using an UPROM cell to provide the stored logic for generating a function signal.

FIG. 3 is a circuit schematic diagram showing a redundancy decoder of the present invention, but using a prior art XOR decoding scheme.

FIG. 4 is a circuit schematic diagram of the XOR decoder of the preferred embodiment.

FIG. 5 is a circuit schematic diagram of the decoder of FIG. 4 used in an alternative embodiment to provide XNOR decoding.

DETAILED DESCRIPTION OF THE PRESENT INVENTION

A decoding circuit for use with redundant memory is described. In the following description, numerous specific details, such as a specific addressing scheme, memory device, etc., are set forth in order to provide a thorough understanding of the present invention. However, it will be obvious to one skilled in the art that the present invention may be practiced without these specific details. In other instances, well-known circuits have not been described in detail in order not to unnecessarily obscure the present invention.

Referring to FIG. 1, a redundancy circuit 10 utilizing a plurality of content addressable memories (CAMs) is shown. Circuit 10 permits the selection of a redundant line, either row or column line, for the purpose of replacing a defective row or column line. An address line and its complement are coupled as inputs to each of the CAMs 11 and the output from each of the CAMs 11 is coupled as an input to a NOR gate 12. For example, address lines $A_1$ and $A_1$/(hereinafter/is used to indicate a complement) are coupled to CAM 1 which output is then coupled as an input to NOR gate 12. In the example of FIG. 1, circuit 10 is comprised of four CAM cells 1–4, each having its respective pair of input lines. It is to be appreciated that the actual number of CAMs 11, as well as the number of address lines coupled to each CAM 11, is merely a design choice. The output of the NOR gate 12 is coupled as a decoded signal for activating the redundant row or column.

Although various schemes can be used to program each of the CAMs 11, circuit 10 utilizes memory cells 13 for storing the program information for providing the decoding necessary to activate the respective redundant line. That is, once the memory array chip is manufactured and defective cells are located each of the memory cells 13 are programmed such that when the address of the defective line is presented on the address lines, the decoding provided by memory 13 and CAM 11 causes an output from NOR gate 12 for activating the redundant row or column line. Memory cells 13 will be of the type of main and redundant memory embodied in the semiconductor device. That is, if the device is an EPROM, then memory cells 13 are comprised of EPROM cells. Further, once memory cells 13 have been programmed corresponding to the defective memory line, it is typically made unerasable so that subsequent erasure of the main or redundant memory will not cause memory cells 13 to be erased. Additionally, although CAM 11 is shown having one output in the drawing of FIG. 1, however, it can be comprised of two signals, such as an output and its complement. Further, in terms of defining content addressable memory, other definitions include the memory cell 13 as an integral part of cell 11, such that the terminology defining the CAM includes both cells 13 and 11. Also, CAM cell of FIG. 1 can include other decoding logic, such as XOR'-ing of the address signals.

Referring to FIG. 2, CAM 11 of the present invention is shown in circuit schematic form. Although various CAM circuits can be used for CAM 11, the preferred embodiment uses circuit 20, wherein each CAM 11 uses a single UPROM (unerasable programmable read-only-memory). UPROM cell 21 is actually an EPROM cell which is made non-erasable, so that once programmed with the decoding information for the address of the defective line, the decoding information is permanently retained. The output of the UPROM 21 is coupled through transistor 22 to node 23. Node 23 is coupled to a voltage Vcc through transistors 24 and 25. Node 23 is also coupled to Vcc by a second pair of series transistors 26 and 27. Transistors 24–27 are all p-type devices, wherein the gates of transistors 25 and 27 are grounded so that transistors 25 and 27 operate as loads for each of its respective legs. The gate of transistor 24 is coupled to receive a reset signal for resetting circuit 20.

Node 23 is coupled through inverter 28 which output is also coupled to the gate of transistor 26. The output of inverter 28 provides an f/signal. The output of inverter 28 is also coupled through inverter 29 to provide an output signal f. The function signal f and its complement f/ provide the program decoding logic as output of CAM cell 11. UPROM 21 of FIG. 2 corresponds to the memory 13 of FIG. 1 and circuit 20 is included in CAM 11 of FIG. 1.

Transistor 22 is an n-type device having its gate coupled to a reference voltage. When $V_{REF}$ is applied, transistor 22 is activated causing UPROM 21 to be coupled to node 23. Alternatively, transistor 22 can be turned on permanently.

In operation, once defective cell locations have been determined, then the various UPROM cells are programmed or not programmed (erased) to store the logic states which are then used to provide the decoding for redundancy. The output signals f and f/ correspond to the pair of function outputs of each CAM 11, which signals f and f/ depend on its corresponding UPROM 21.

Inverters 28 and 29 provide the necessary drive for driving the pair of output lines. The single UPROM scheme of FIG. 2 saves chip area since only one UPROM cell is needed for each CAM cell. Further, it simplifies the redundancy programming modes, as well as reducing the initial standby current of the silicon, from prior art two UPROM CAMs. In operation, because the gate of the UPROM 21 is coupled to a high voltage, UPROM 21 will conduct if it is in an erased state and will not conduct if it is in a programmed state. Therefore, node 23 will correspond to a high state or a low state depending on the stored state of UPROM 21.

It is to be noted that with circuit 20, if the reset leg, comprised of transistors 24 and 25, is not present, then node 23 can be forced to either the high or the low state if UPROM 21 is programmed. That is, because of the half-latch configuration of circuit 20, using a single UPROM 21 node 23 can be forced to store an improper state when UPROM 21 is in a programmed state. A possibility of circuit 20 initializing to a wrong state can not occur when UPROM 21 is in an unprogrammed (erased) state, because node 23 is pulled low to ground.

In order to prevent node 23 from latching to the improper state when UPROM 21 is in a programmed state, reset circuitry in the way of transistors 24 and 25 is provided. A reset/ signal is coupled to the gate of transistor 24 to activate transistor 24 when a reset is initiated. Therefore, when UPROM 21 is in a programmed state, reset will cause node 23 to be forced to a high condition through transistors 24 and 25. By use of this reset signal, node 23 will always latch high when reset if UPROM 21 is programmed, but will latch low if UPROM 21 is erased.

Referring to FIG. 3, one technique of using a prior art scheme to provide the decoding is shown in FIG. 3. Aside from circuit 20 of FIG. 2, each CAM cell 11 includes, and is coupled to control the enablement of, a pair of CMOS input transistors for each pair of address lines. For example, signal f is coupled to the gates of transistor 31 and 32 while f/ is coupled to the gates of transistors 33 and 34. Transistors 31 and 34 are n-channel transistors while transistors 32 and 33 are p-channel transistors. Address signal $A_n$ is coupled through the pair of transistors 31 and 33 while $A_n$/ is coupled through transistors 32 and 34. Therefore, when f is high and f/ is low, transistors 31 and 33 conduct passing address signal $A_n$. When f is low and f/ is high, transistors 32 and 34 conduct passing address signal $A_n$/. Therefore, depending on the stored state of its memory cell 13, each of the CAMs 11 provides appropriate f and f/ signals to its input coupling transistors 31-34, such that the proper address signal is coupled through. It is to be appreciated that although one input circuitry is shown is reference to CAM 4, each CAM 11 includes such circuitry comprised of transistors 31-34.

In FIG. 3, a prior art NOR gate 12a is shown comprised of a plurality of n-channel transistors 15 having their drains coupled to an output node 16. Node 16 is tied to a voltage, such as Vcc, through a load 17. The sources of each of the transistors 15 are coupled to ground while each of the gates are coupled to its respective CAM 11, which outputs $A_n$ or $A_n$/ depending on its function signals. Logically NOR gate 12a provides the NOR function as NOR gate 12 of FIG. 1. It is to be noted that the entity of circuits 11 and 12a in FIG. 3 comprise a XOR function with respect to inputs f and $A_n$, and their complements.

Referring to FIG. 4, a circuit 40 of the present invention for providing the XOR decoding is shown. Circuit 40 is comprised of transistors 41, 42, 43 and 44 and load device 45. Transistors 41 and 42 are coupled in series between an output node 46 and ground, while transistors 43 and 44 are coupled in series between output node 46 and ground to form a second series leg paralleling the first. Load 45, shown schematically as a resistor is coupled between a voltage, such as Vcc, and the output node 46. The output is taken from node 46. Gate of transistor 41 is coupled to receive address signal $A_n$, while the gate of transistor 43 is coupled to receive the address signal $A_n$/. The gate of transistor 42 is coupled to receive the CAM function signal f, while the gate of transistor 44 is coupled to receive the CAM function signal f/. It is to be noted that the configuration as shown in circuit 40 has the same truth table as the prior art circuit of FIG. 3. That is, the state of the output will depend on the state of the signals $A_n$ and f and their complements.

It is to be noted that each leg of the XOR gate provided by circuit 40 is comprised of two parallel sets of two series n-channel transistors 41-42 and 43-44 that accomplish in one single stage the steering of the address signal $A_n$ or its complement $A_n$/. Whereas in the prior art circuit of FIG. 3, it require a two stage circuit to derive the XOR output. The first stage being transistors 31-34 and the second stage being transistor 15. The reduction to a single stage in the preferred embodiment allows for faster decoding to be achieved and, further, minimizes the loading on the address lines. Additionally, the use of all n-channel devices to provide the XOR logic, versus the complementary metal-oxide semiconductor (CMOS) input arrangement of FIG. 3, provides for an inherently simpler design, due to all transistors 14-44 being n-channel transistors. Also, circuit 40 reduces the chip layout by providing for a more compact layout since p-channel devices and n-wells occupy more physical space in a p-substrate technology. It is appreciated that an equivalent circuit in an n-type substrate technology can be constructed using p-channel devices for devices 41-44.

Referring to FIG. 5, the same identical circuit 40 is shown. However, in this instance transistor 44 is coupled to receive the function signal f while the gate of transistor 42 is coupled to receive the function complement signal f/. This configuration allows for a XNOR configuration instead of a XOR configuration of FIG. 4. Typically XOR or XNOR is used for redundancy decoding, although other logic can be implemented. Additionally, by using an n-channel transistor 47 in series with the load 45a and by taking an output from the junction of this transistor 47 and load 45a, a further improvement to the switching speed is obtained. By rationing transistor 47 to each series pair 41-42 and 43-44, the voltage swing at the output can be limited to to less than full swing between Vcc and ground, improving the switching time. It is to be appreciated that this same technique can be used in the circuit of FIG. 4.

In reference to FIGS. 4 and 5, it is to be appreciated that the outputs of a number of circuits 40 can be coupled together to provide the XNOR (or XOR) decoding. Alternatively each circuit 40 can operate independently, to provide the necessary decoding needed for decoding the address signals for activating the redundant memory line. Further, it is also appreciated that load 45 (and 45a) operates as a pull up and that various devices, including a resistor or a p-channel transistor, can be used.

Additionally, it is to be noted that the circuit of the present invention, as well as the redundant memory and its associated circuitry are embodied in an integrated circuit chip containing the main memory.

I claim:

1. In a decoding scheme for a redundant memory which includes a content addressable memory (CAM) for decoding an address signal to access locations in said redundant memory, an improvement in a decoding circuit, comprising:
   a first transistor;
   a second transistor coupled to said first transistor such that said first and second transistors are in series between a first node and a circuit return;
   a third transistor;
   a fourth transistor coupled to said third transistor such that said third and fourth transistors are in series between said first node and said return;
   gates of said first and third transistors being coupled to said CAM to receive a programmed signal and its complement;
   gates of said second and fourth transistors being coupled to receive said address signal and its complement;
   wherein said four transistors provide decoding of said address signal according to programming provided by said CAM.

2. The improvement defined by claim 1 further including a load device coupled between said first node and a supply voltage.

3. The improvement defined by claim 1 wherein said first node provides an output node for activating said redundant memory.

4. The improvement defined by claim 1 further including a fifth and sixth transistors coupled in series between said first node and a supply voltage and an output for activating said redundant memory is taken at a junction of said fifth and sixth transistors.

5. The improvement defined by claim 4 wherein said first, second, third and fourth transistors are n-channel transistors.

6. The improvement defined by claim 5 wherein said fifth transistor coupled to said first node is an n-channel transistor and said sixth transistor coupled to said supply voltage is a p-channel transistor.

7. In a decoding scheme for a redundant memory which includes a content addressable memory (CAM) for decoding an address signal to access locations in said redundant memory, an improvement in a decoding circuit, comprising:
- a first n-channel transistor having its source coupled to ground;
- a second n-channel transistor having its source coupled to the drain of said first n-channel transistor and its drain coupled to a first node;
- a third n-channel transistor having its source coupled to ground;
- a fourth n-channel transistor having its source coupled to the drain of said third n-channel transistor and its drain coupled to said first node;
- gates of said four n-channel transistors are coupled to receive a programmed signal, its complement, said address signal and its complement; wherein one of said address signal or its complement is provided to one of said first and second n-channel transistors and one of said programmed signal or its complement is provided to other of said first and second n-channel transistors; and wherein other of said address signal or its complement is provided to one of said third and fourth n-channel transistors and other of said programmed signal or its complement is provided to other of said third and fourth n-channel transistors;
- wherein said four n-channel transistors provide decoding of said address signal according to programming provided by said CAM.

8. The improvement defined by claim 7 further including a load device coupled between said first node and a supply voltage and said first node provides an output for activating said redundant memory.

9. The improvement defined by claim 8 wherein said decoding circuit provides a XNOR function.

10. The improvement defined by claim 8 wherein said load device is a p-channel transistor.

11. The improvement defined by claim 7 further including a fifth n-channel transistor and a p-channel transistor; said fifth n-channel transistor having its source coupled to said first node and its drain coupled to an output node; said p-channel transistor having its source coupled to a supply voltage and its drain coupled to said output node; and wherein said output node provides an output for activating said redundant memory.

12. The improvement defined by claim 11 wherein said fifth n-channel transistor is ratio biased with other said n-channel transistors to inhibit full voltage swings.

13. The improvement defined by claim 11 wherein said decoding circuit provides a XNOR function.

* * * * *

UNITED STATES PATENT AND TRADEMARK OFFICE
CERTIFICATE OF CORRECTION

PATENT NO.   : 5,088,066
DATED        : February 11, 1992
INVENTOR(S)  : Hernan A. Castro It is certified that error appears in the above-indentified patent and that said Letters Patent is hereby corrected as shown below:

Column 5, Line 57 Delete "14" and insert --41--.

Signed and Sealed this

First Day of March, 1994

BRUCE LEHMAN

Attest:

*Attesting Officer*        *Commissioner of Patents and Trademarks*